US007671532B2

(12) United States Patent
Kim

(10) Patent No.: US 7,671,532 B2
(45) Date of Patent: Mar. 2, 2010

(54) ORGANIC ELECTROLUMINESCENT DEVICE AND METHOD OF MANUFACTURING THE SAME

(75) Inventor: Woo Chan Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 615 days.

(21) Appl. No.: 11/249,403

(22) Filed: Oct. 14, 2005

(65) Prior Publication Data

US 2006/0087229 A1     Apr. 27, 2006

(30) Foreign Application Priority Data

| Oct. 21, 2004 | (KR) | 10-2004-0084502 |
| Oct. 21, 2004 | (KR) | 10-2004-0084505 |
| Oct. 25, 2004 | (KR) | 10-2004-0085201 |
| Nov. 19, 2004 | (KR) | 10-2004-0094954 |
| Nov. 19, 2004 | (KR) | 10-2004-0094957 |

(51) Int. Cl.
*H01J 1/62* (2006.01)

(52) U.S. Cl. .................. 313/509; 313/512; 313/498; 445/25

(58) Field of Classification Search ......... 313/498–512; 315/169.1–169.3; 428/690–691, 917; 438/26–29, 438/34, 82; 257/40, 72, 98–100, 642–643, 257/759; 427/66, 532–535, 539, 58, 64; 445/24–25
See application file for complete search history.

(56) References Cited

U.S. PATENT DOCUMENTS

| 2,440,135 A | 4/1948 | Alexander |
| 5,157,240 A | 10/1992 | Chow |
| 5,272,298 A | 12/1993 | Taguchi et al. |
| 6,195,142 B1 | 2/2001 | Gyotoku et al. |
| 6,576,351 B2 * | 6/2003 | Silvernail ............... 428/690 |
| 6,833,668 B1 * | 12/2004 | Yamada et al. ........... 313/505 |
| 7,145,290 B2 * | 12/2006 | Kang ..................... 313/512 |

(Continued)

FOREIGN PATENT DOCUMENTS

CN     1429052 A     7/2003

(Continued)

OTHER PUBLICATIONS

H. Lifka et al., "*Thin Film Encapsulation of OLED Displays with a NONON Stack*," SID Symposium Digest of Technical Papers, May 2004, pp. 1384-1387.

(Continued)

*Primary Examiner*—Peter J Macchiarolo
*Assistant Examiner*—Donald L Raleigh
(74) *Attorney, Agent, or Firm*—Birch, Stewart, Kolasch & Birch, LLP

(57) ABSTRACT

The present invention relates to a thin organic electroluminescent device capable of preventing permeation of oxygen or moisture. The organic electroluminescent device according to one embodiment of the present invention includes a substrate, a plurality of pixels and a planarization layer. The substrate has grooves formed at the periphery of an active area. The pixels are formed in the active area. The planarization layer covers the pixels on the substrate. The passivation layer covers the planarization layer and the grooves. Since the organic electroluminescent device includes the grooves or path extending sections, oxygen ($O_2$), water ($H_2O$), etc. are not permeated into the inside of a passivation layer.

11 Claims, 7 Drawing Sheets

U.S. PATENT DOCUMENTS

| | | |
|---|---|---|
| 2002/0113549 A1 | 8/2002 | Yamazaki et al. |
| 2002/0140347 A1* | 10/2002 | Weaver ................. 313/506 |
| 2003/0016966 A1 | 1/2003 | Hattori et al. |
| 2003/0017297 A1* | 1/2003 | Song et al. ............... 428/68 |
| 2003/0062533 A1 | 4/2003 | Yee et al. |
| 2003/0082859 A1* | 5/2003 | Ichijo et al. ............. 438/166 |
| 2003/0168966 A1 | 9/2003 | Kobayashi et al. |
| 2004/0041147 A1 | 3/2004 | Park |
| 2004/0113550 A1* | 6/2004 | Adachi et al. ............ 313/512 |
| 2004/0178727 A1* | 9/2004 | Song et al. .............. 313/512 |
| 2004/0195960 A1* | 10/2004 | Czeremuszkin et al. ..... 313/504 |
| 2005/0014022 A1* | 1/2005 | Park ..................... 428/690 |
| 2005/0046346 A1* | 3/2005 | Tsuchiya et al. .......... 313/509 |
| 2005/0068474 A1* | 3/2005 | Su ........................ 349/69 |
| 2005/0082534 A1* | 4/2005 | Kim et al. ................ 257/72 |
| 2005/0140347 A1* | 6/2005 | Chen et al. .............. 323/282 |
| 2005/0155704 A1* | 7/2005 | Yokajty et al. ........... 156/295 |
| 2005/0260827 A1* | 11/2005 | Cheng et al. ............. 438/435 |

FOREIGN PATENT DOCUMENTS

| | | | |
|---|---|---|---|
| CN | 1533682 | A | 9/2004 |
| CN | 1612650 | A | 5/2005 |
| DE | 262551 | A3 | 12/1988 |
| EP | 1 562 231 | A3 | 8/2005 |
| JP | 60255971 | | 12/1985 |
| JP | 2004079408 | A * | 3/2004 |
| JP | 2004265615 | A * | 9/2004 |
| KR | 10-2004-0058102 | | 7/2004 |

OTHER PUBLICATIONS

V. Kuznetsov et al., "*Production of Thin Films of Silicon Monoxide Without Through Holes,*" vol. 1968, No. 3, May 1, 1968, pp. 723-724, XP002300025.

* cited by examiner

ORGANIC ELECTROLUMINESCENT DEVICE AND METHOD OF MANUFACTURING THE SAME

CROSS-REFERENCE TO RELATED APPLICATIONS

This application claims priorities from Korean Patent Application Nos. 2004-84502 and 2004-84505, filed on Oct. 21; 2004, 2004-85201, filed on Oct. 25, 2004; and 2004-94954 and 2004-94957, filed on Nov. 19, 2004, the contents of which are incorporated herein by reference in their entirety.

BACKGROUND OF THE INVENTION

1. Field of the Invention

The present invention relates to an organic electroluminescent device and a method of manufacturing the same. More particularly, the present invention relates to a thin organic electroluminescent device capable of preventing permeation of oxygen or water and a method of manufacturing the same.

2. Description of the Related Art

An organic electroluminescent device as self light-emitting device emits a light having a predetermined wavelength when a certain voltage is applied thereto.

FIG. 1A is a plane view illustrating a conventional first organic electroluminescent device.

In FIG. 1A, the organic electroluminescent device includes a plurality of pixels 30, a getter 50 and a cell cap 70.

Each of the pixels 30 includes an anode electrode layer 100, an organic layer 120 and a cathode electrode layer 140 formed in sequence on a substrate 10. In case a positive voltage and a negative voltage are respectively applied to the anode electrode layer 100 and the cathode electrode layer 140, a light having a certain wavelength is emitted from the organic layer 120.

The getter 50 is attached to the cell cap 70, and removes oxygen ($O_2$) or water ($H_2O$) in the organic electroluminescent device.

The cell cap 70 covers the pixels 30 so that oxygen ($O_2$), water ($H_2O$), etc. are not permeated into the inside of the cell cap 70. In this case, the getter 50 should not be contacted to the cathode electrode layer 140. Therefore, a space is required between the getter 50 and the cathode electrode layer 140, and so the thickness of the first organic electroluminescent device is increased.

Recently, a mobile phone, etc. employing an organic electroluminescent device tends to be miniaturized. Hence, the thickness of the organic electroluminescent device also should be reduced. However, the first organic electroluminescent device includes the cell cap 70 to which the getter 50 is attached, and so the thickness of a mobile phone employing the conventional first organic electroluminescent device could not be reduced.

Accordingly, the following second organic electroluminescent device was developed.

FIG. 1B is a plane view illustrating a conventional second organic electroluminescent device.

In FIG. 1B, the second organic electroluminescent device includes pixels 30, a planarization layer 200 and a passivation layer 220.

The planarization layer 200 is formed on the pixels 30, thereby intensifying the adhesive force between the pixels 30 and the passivation layer 220.

The passivation layer 220 is formed on the planarization layer 200 to prevent oxygen ($O_2$), water ($H_2O$), etc. permeating into the inside of the passivation layer 220. However, the thickness of edge part of the passivation layer 220 which is attached to the substrate 10 is thin, and thus oxygen ($O_2$), water ($H_2O$), etc. could be permeated into the inside of the planarization layer 200. As a result, a part of the pixels 30 may not emit a light.

Accordingly, there has been a need for another organic electroluminescent device that can prevent the permeation of oxygen ($O_2$), water ($H_2O$), etc. and is thin.

SUMMARY OF THE INVENTION

It is a feature of the present invention to provide an organic electroluminescent device capable of preventing the permeation of oxygen ($O_2$), water ($H_2O$), etc. and a method of manufacturing the same.

An organic electroluminescent device according to a first embodiment of the present invention includes a substrate, a plurality of pixels and a planarization layer. The substrate has grooves formed at the periphery of an active area. The pixels are formed in the active area. The planarization layer covers the pixels on the substrate. The passivation layer covers the planarization layer and the grooves.

An organic electroluminescent device according to a second embodiment of the present invention includes a substrate, a planarization layer, a permeation-preventing layer and a passivation layer. The substrate has a plurality of pixels formed in active area. The planarization layer covers the pixels. The permeation-preventing layer covers the planarization layer. The passivation layer is formed on the permeation preventing layer.

An organic electroluminescent device having a plurality of pixels formed on a substrate according to a third embodiment of the present invention includes a planarization layer, a plurality of path extending sections and a passivation layer. The planarization layer covers the pixels. The path extending sections are formed on the substrate at the periphery of the planarization layer. The passivation layer covers the planarization layer and the path extending sections.

A method of manufacturing an organic electroluminescent device according to a first embodiment of the present invention includes producing a substrate having a plurality of grooves at the periphery of an active area by patterning the substrate; forming a plurality of pixels in the active area; forming a planarization layer on the pixels so that the pixels are covered by the planarization layer; and forming a passivation layer on the planarization layer and the grooves so that the planarization layer and the grooves are covered by the passivation layer.

A method of manufacturing an organic electroluminescent device having a plurality of pixels formed on a substrate according to a second embodiment of the present invention includes forming a planarization layer on the pixels so that the pixels are covered by the planarization layer; forming a plurality of path extending sections on the substrate at the periphery of an area in which the planarization layer is formed; and forming a passivation layer on the planarization layer and the path extending sections.

A method of manufacturing an organic electroluminescent device having a plurality of pixels according to a third embodiment of the present invention includes forming a planarization layer on the pixels so that the pixels are covered by the planarization layer; forming a permeation-preventing layer on the planarization layer so that the planarization layer is covered by the permeation-preventing layer; and forming a passivation layer on the permeation-preventing layer.

As described above, the present organic electroluminescent device and a method of manufacturing the same includes grooves or path extending sections, and thus oxygen ($O_2$), water ($H_2O$), etc. are not permeated into the inside of a passivation layer.

In addition, the present organic electroluminescent device and a method of manufacturing the same includes a permeation-preventing layer, and thus ($O_2$), water ($H_2O$), etc. are not permeated into the inside of the permeation-preventing layer.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Hereinafter, the preferred embodiments of the present invention will be explained in more detail with reference to the accompanying drawings.

Figure 1A:
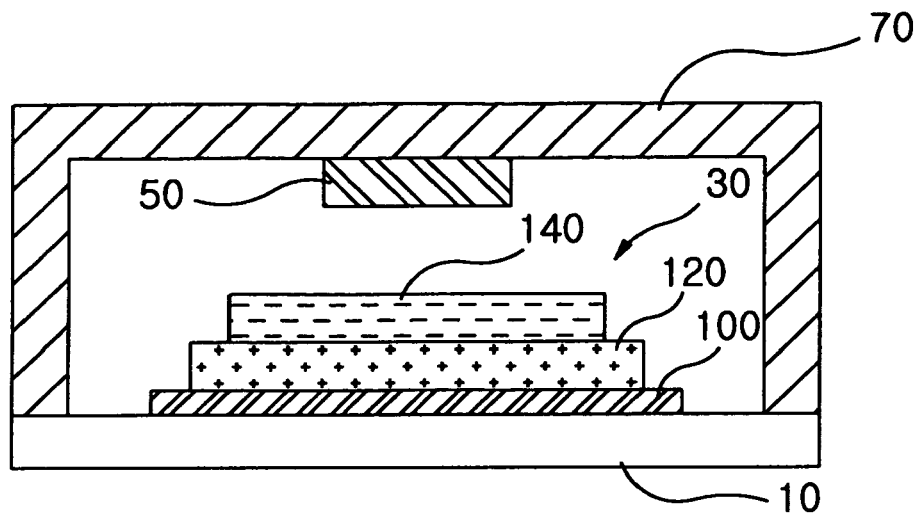
FIG. 1A is a plane view illustrating a conventional first organic electroluminescent device.
Figure 1B:
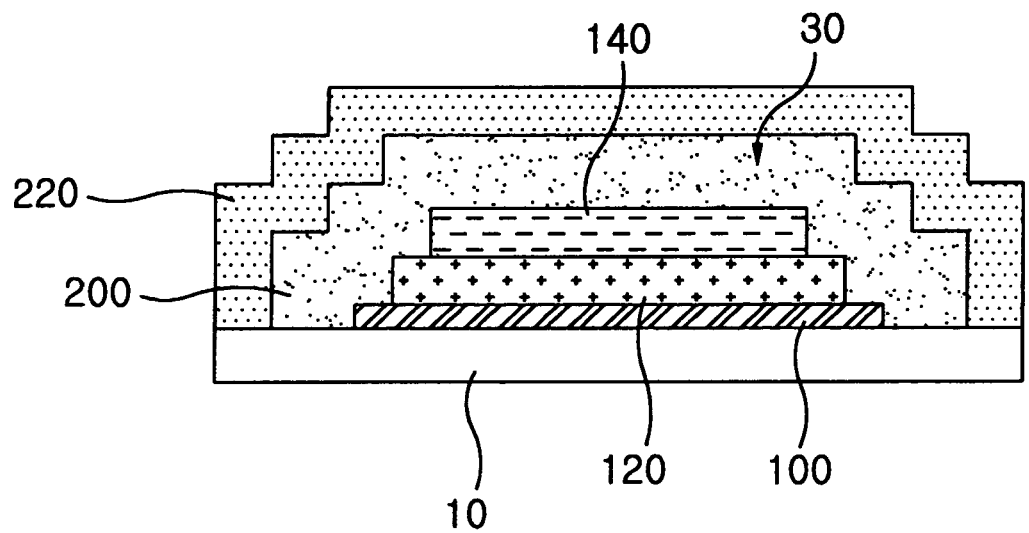
FIG. 1B is a plane view illustrating a conventional second organic electroluminescent device.
Figure 2A:
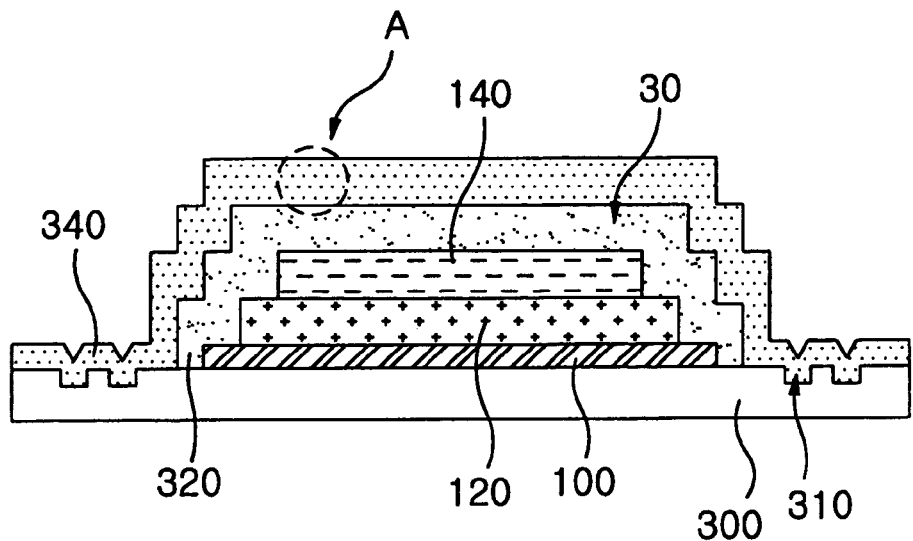
FIG. 2A is a plane view illustrating an organic electroluminescent device according to a first embodiment of the present invention.
Figure 2B:
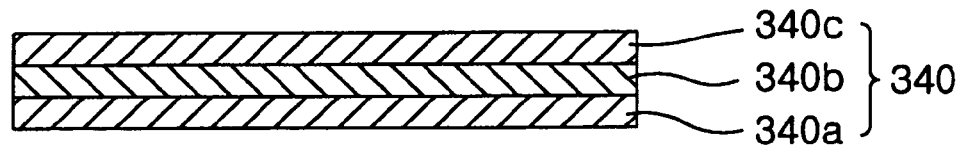
FIG. 2B is a view illustrating enlarged A part in FIG. 2A according to one embodiment of the present invention.

FIG. 2A is a plane view illustrating an organic electroluminescent device according to a first embodiment of the present invention, and FIG. 2B is a view illustrating enlarged A part in FIG. 2A according to one embodiment of the present invention. In addition, FIG. 2C is a view illustrating enlarged A part in FIG. 2A according to another embodiment of the present invention.

Figure 2C:
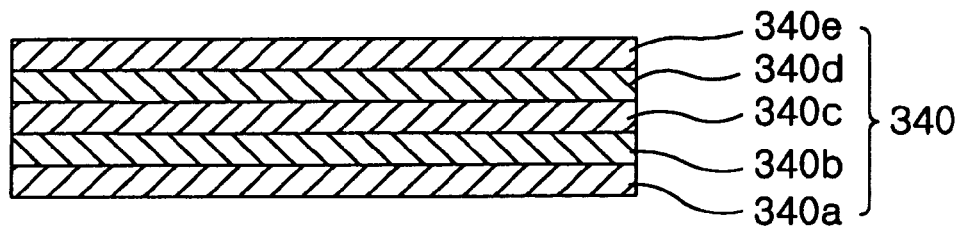
FIG. 2C is a view illustrating enlarged A part in FIG. 2A according to another embodiment of the present invention.

In FIG. 2A to FIG. 2C, the organic electroluminescent device of the present invention includes a substrate 300, pixels 30, a planarization layer 320 and a passivation layer 340.

The substrate 300 has grooves 310 formed at the periphery of an active area in which the pixels 30 are formed.

The pixels 30 are formed in the active area on the substrate 300 as shown in FIG. 2A. Additionally, the pixels 30 are formed by depositing in sequence an anode electrode layer 100, an organic layer 120 and a cathode electrode layer 140 on the substrate 300.

The anode electrode layer 100 provides holes to the organic layer 120 in case a certain positive voltage is applied thereto, for example, indium tin oxide film (ITO film).

The cathode electrode layer 140 provides electrons to the organic layer 120 in case a certain negative voltage is applied thereto.

The organic layer 120 includes a hole transporting layer (HTL), an emitting layer (EML) and an electron transporting layer (ETL) formed in sequence on the anode electrode layer 100. In case the positive voltage and the negative voltage are respectively applied to the anode electrode layer 100 and the cathode electrode layer 140, the HTL transports the holes provided from the anode electrode layer 100 into the EML, and the ETL transports the electrons provided from the cathode electrode layer 140 into the EML. The transported holes and electrons are recombined in the EML, and so a light having a predetermined wavelength is emitted from the EML.

The planarization layer 320 covers the pixels 30, and is a non-conductive organic layer. For example, the planarization layer 320 consisted of BenzoCyclo-Butene (BCB) or SiLK (Trademark of Dow Chemical Company) intensifies the adhesive force between the pixels 30 and the passivation layer 340.

The passivation layer 340 as an inorganic layer is formed on the planarization 320 and the grooves 310, and prevents the permeation of oxygen ($O_2$) or water ($H_2O$).

In FIG. 2B, the passivation layer 340 according to one embodiment of the present invention includes a first silicon oxide layer 340A, a silicon nitride layer 340B and a second silicon oxide layer 340C formed in sequence on the planarization layer 320 and the grooves 310, and so prevents oxygen ($O_2$) or water ($H_2O$) from permeating into the inside of the passivation layer 340. Here, the silicon nitride layer 340B is excellent to prevent the permeation of oxygen ($O_2$) or water ($H_2O$), but if formed thick, it may make the substrate 300 bend. Hence, the silicon nitride layer 340B should be formed thinly in order to prevent the permeation of oxygen ($O_2$) or water ($H_2O$).

In FIG. 2C, the passivation layer 340 according to another embodiment of the present invention includes a first silicon oxide layer 340A, a first silicon nitride layer 340B, a second silicon oxide layer 340C, a second silicon nitride layer 340D and a third silicon oxide layer 340E formed in sequence on the planarization layer 320 and the grooves 310.

In brief, the passivation layer 340 may include at least one silicon nitride layer. However, it is desirable that the passivation layer 340 includes a plurality of thin silicon nitride layers as shown in FIG. 2C.

In the organic electroluminescent device of the present invention, the passivation layer 340 is formed on the substrate 300 to which the grooves 310 are formed, and thus the length of a permeation pathway through which oxygen ($O_2$), water ($H_2O$), etc. can permeate is augmented. As a result, oxygen ($O_2$), water ($H_2O$), etc. are not permeated into the inside of the passivation layer 340.

In addition, the organic electroluminescent device does not include a cell cap unlike the conventional organic electroluminescent device. Thus, the organic electroluminescent device of the present invention is thinner than the conventional organic electroluminescent device. Accordingly, a mobile phone, etc. employing the organic electroluminescent device of the present invention may be thinner than a mobile phone, etc. employing the conventional organic electroluminescent device.

FIG. 3A to FIG. 3D are plane views illustrating an organic electroluminescent device according to other embodiments of the present invention.

Figure 3A:
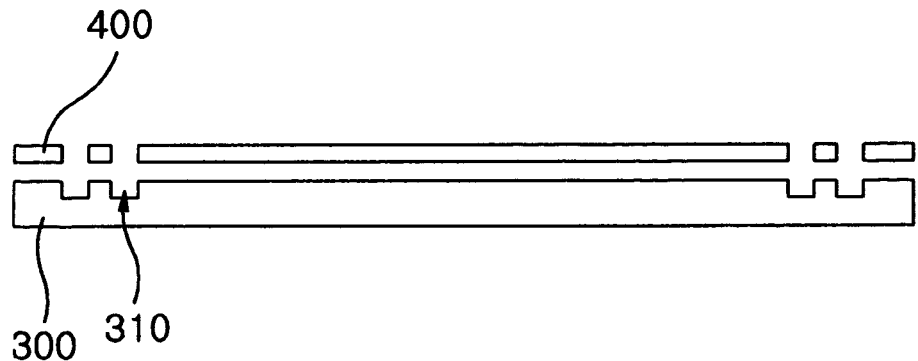
FIG. 3A to FIG. 3D are plane views illustrating an organic electroluminescent device according to other embodiments of the present invention.

In FIG. 3A, grooves 310 are formed on a substrate 300 by etching the substrate 300 by using a certain mask 400.

Figure 3B:
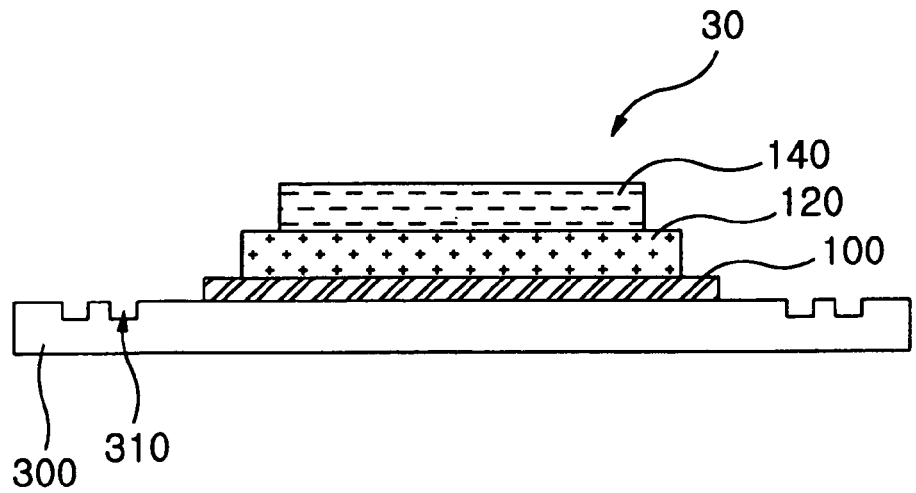

Subsequently, pixels 30 are formed on the substrate 300 as shown in FIG. 3B.

Figure 3C:
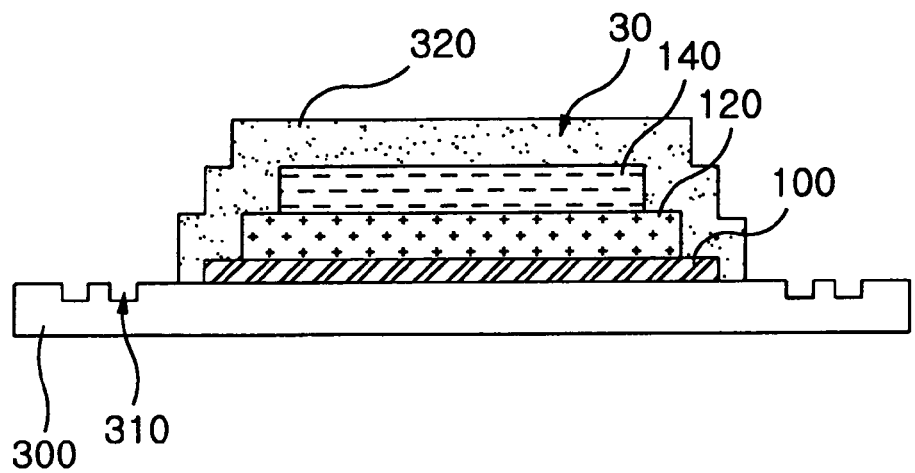

Then, a planarization layer 320 is formed on the substrate 300 to cover the pixels 30 as shown in FIG. 3C. Specifically, the planarization layer 320 is formed when planarization material of non-conductive organic material is deposited on the pixels. In another embodiment, the planarization layer 320 is formed by polishing the upper side of the planarization material when the material is deposited on the pixels 30.

Figure 3D:
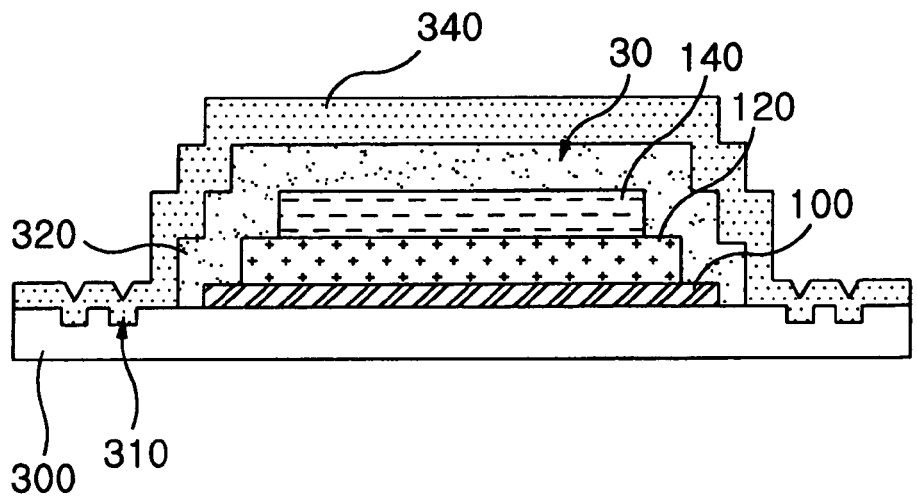

Subsequently, the passivation layer 340 is formed on the planarization layer 320 and the grooves 310 as shown in FIG. 3D.

In a method of manufacturing the organic electroluminescent device according to another embodiment of the present invention, the grooves 310 are formed after the planarization layer 320 is deposited to cover the pixels 30. In this case, the grooves 310 should be formed in a vacuum atmosphere in order to prevent the permeation of oxygen ($O_2$), water ($H_2O$), etc.

Figure 4A:
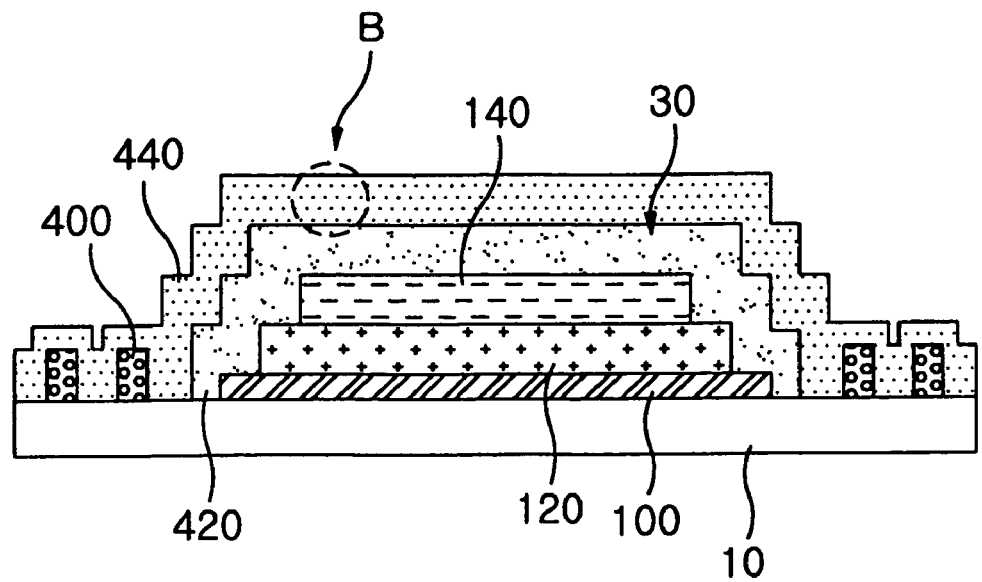
FIG. 4A is a plane view illustrating an organic electroluminescent device according to a second embodiment of the present invention.
Figure 4B:
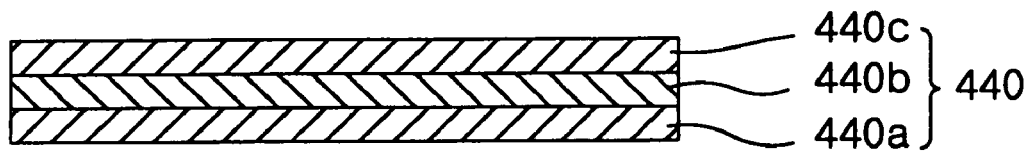
FIG. 4B is a view illustrating the enlarged B of FIG. 4A according to one embodiment of the present invention.

FIG. 4A is a plane view illustrating an organic electroluminescent device according to a second embodiment of the present invention, and FIG. 4B is a view illustrating enlarged B of FIG. 4A according to one embodiment of the present invention. Also, FIG. 4C is a view illustrating enlarged B of FIG. 4A according to another embodiment of the present invention.

Figure 4C:
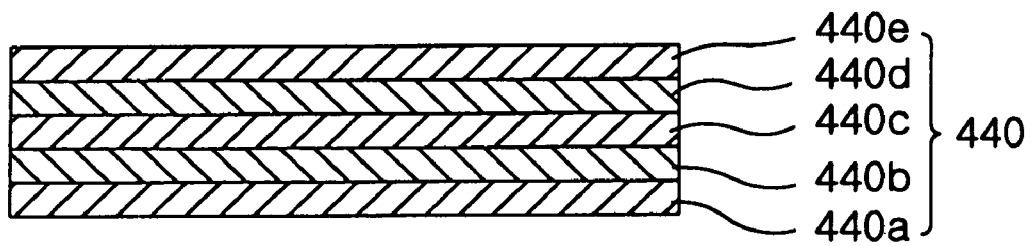
FIG. 4C is a view illustrating the enlarged B of FIG. 4A according to another embodiment of the present invention.

In FIG. 4A to FIG. 4C, the organic electroluminescent device of the present invention includes path extending sections 400, pixels 30, a planarization layer 420 and a passivation layer 440.

The path extending sections 400 are formed on the substrate 10 at the periphery of the planarization layer 420 as shown in FIG. 4A. Here, the path extending sections 400 have square shape or rectangular shape.

The planarization layer 420 as a non-conductive organic layer covers the pixels 30. For example, the planarization layer 420 consisted of BCB or SiLK intensifies the adhesive force between the pixels 30 and the passivation layer 440.

The passivation layer 440 is formed on the substrate 10 on which the planarization layer 420 and the path extending sections 400 are formed. In addition, the passivation layer 440 as an inorganic layer prevents the permeation of oxygen ($O_2$) or water ($H_2O$).

In FIG. 4B, the passivation layer 440 according to one embodiment of the present invention includes a first silicon oxide layer 440A, a silicon nitride layer 440B and a second silicon oxide-layer 440C formed in sequence on the substrate 10 on which the planarization layer 420 and the path extending sections 400 are formed.

In FIG. 4C, the passivation layer 440 according to another embodiment of the present invention includes a first silicon oxide layer 440A, a first silicon nitride layer 440B, a second silicon oxide layer 440C, a second silicon nitride layer 440D and a third silicon oxide layer 440E formed in sequence on the substrate 10 on which the planarization layer 320 and the path extending sections 400 are formed.

In the organic electroluminescent device of the present invention, the passivation layer 440 is formed on the substrate 10 on which the path extending sections 400 are formed, and thus the length of the permeation pathway through which oxygen ($O_2$), water ($H_2O$), etc. are permeated is augmented. As a result, oxygen ($O_2$), water ($H_2O$), etc. are not permeated into the inside of the passivation layer 440.

Hereinafter, a process of manufacturing the organic electroluminescent device will be described in detail.

The pixels 30 are formed on the substrate 10.

Subsequently, the planarization layer 420 is deposited to cover the pixels 30.

Then, the path extending sections 400 are deposited on the substrate 10 at the periphery of the planarization layer 420. In another embodiment, the path extending sections 400 are formed on the substrate 10 before the pixels 30 are formed on the substrate 10.

Subsequently, the passivation layer 440 is formed on the substrate 10 on which the planarization layer 420 and the path extending sections 400 are deposited.

Figure 5:
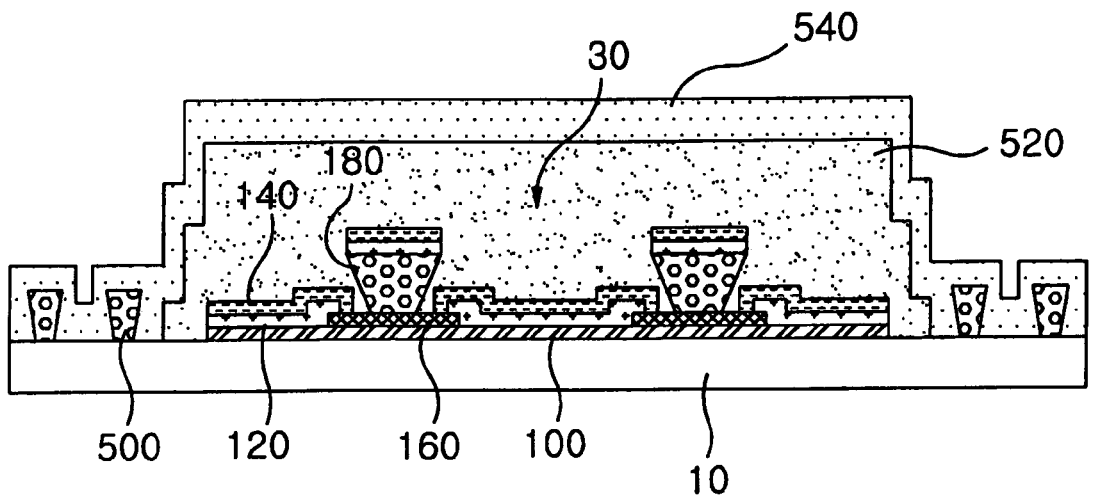
FIG. 5 is a plane view illustrating an organic electroluminescent device according to a third embodiment of the present invention.

FIG. 5 is a plane view illustrating an organic electroluminescent device according to a third embodiment of the present invention.

In FIG. 5, the organic electroluminescent device of the present invention includes pixels 30, path extending sections 500, a planarization layer 520 and a passivation layer 540.

The planarization layer 520 and the passivation layer 540 are the same as those in the second embodiment, and so any further detailed descriptions concerning the same elements will be omitted.

The path extending sections 500 have overhang shape, i.e. the upper base of the path extending sections 500 is longer than the lower base thereof as shown in FIG. 5, and extends the permeation pathway through which oxygen ($O_2$) or water ($H_2O$) permeates. As a result, oxygen ($O_2$) or water ($H_2O$) is not permeated into the inside of the passivation layer 540. In another embodiment, the lower base of the path extending section 500 may be longer than the upper base thereof.

In addition, the path extending sections 500 are made up of the same material as a wall 180.

Hereinafter, a process of manufacturing this organic electroluminescent device will be described in detail.

An anode electrode layer 100 and an insulating layer 160 are deposited in sequence on a substrate 10.

Subsequently, the path extending sections 500 are formed on the substrate 10 when the wall 180 is formed on the insulating layer 160. In another embodiment, the path extending sections 500 may be formed before the pixels 30 are formed, or after the planarization layer 520 is formed.

Then, an organic layer 120 and a cathode electrode layer 140 are formed in sequence on the anode electrode layer 100, i.e. the pixels 30 are formed on the substrate 10.

Subsequently, the planarization layer 520 is formed on the pixels 30 to cover the pixels 30.

Then, the passivation layer 540 is formed on the substrate 10 on which the planarization layer 520 and the path extending sections 500 are formed.

Figure 6A:
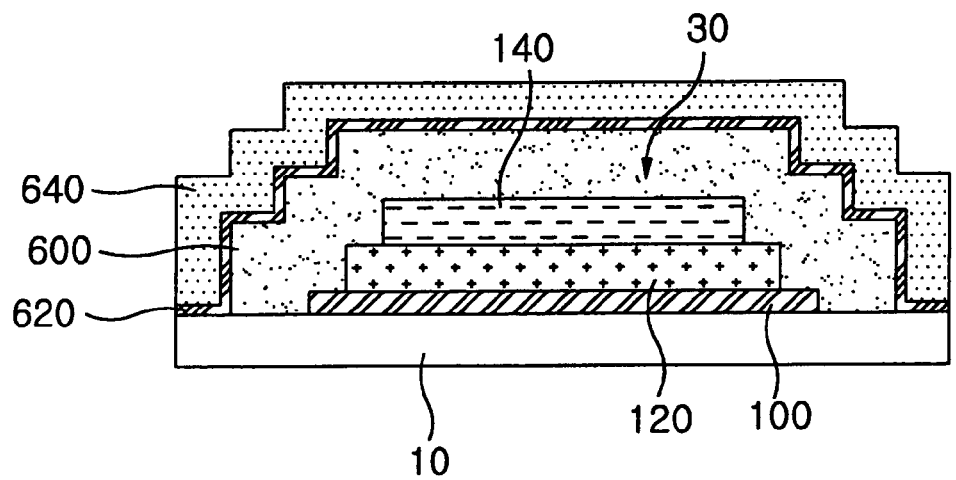
FIG. 6A is a plane view illustrating an organic electroluminescent device according to a fourth embodiment of the present invention.

FIG. 6A is a plane view illustrating an organic electroluminescent device according to a fourth embodiment of the present invention.

In FIG. 6A, the organic electroluminescent device of the present invention includes pixels 30, a planarization layer 600, a permeation-preventing layer 620 and a passivation layer 640.

The planarization layer 600 covers the pixels 30.

The permeation-preventing layer 620 is formed on the planarization layer 600 to cover the planarization layer 600, and is made up of metal such as aluminium (Al), titanium (Ti) or titanium nitride (TiN). Here, the metal is reactive to oxygen ($O_2$) or water ($H_2O$). Hence, the metal is oxidized in case oxygen ($O_2$) or water ($H_2O$) is permeated, and so the permeation-preventing layer 620 is converted into an oxide layer. The density of the converted oxide layer is higher than that of the metal, and thus oxygen ($O_2$) or water ($H_2O$) is not diffused along the converted oxide layer. As a result, after the oxide layer is formed, oxygen ($O_2$) or water ($H_2O$) is not permeated into the inside of the permeation-preventing layer 620.

The passivation layer 640 is formed on the permeation-preventing layer 620.

The passivation layer 640 according to one embodiment of the present invention is formed by depositing in sequence a first silicon oxide layer, a silicon nitride layer and a second silicon oxide layer on the permeation-preventing section 620.

The passivation layer 640 according to another embodiment of the present invention is formed by depositing in sequence a first silicon oxide layer, a first silicon nitride layer, a second silicon oxide layer, a second silicon nitride layer and a third silicon oxide layer on the permeation-preventing layer 620.

Hereinafter, a method of manufacturing the organic electroluminescent device will be described in detail.

The pixels 30 are formed on the substrate 10, and then the planarization layer 600 is formed on the pixels 30 to cover the pixels 30.

Subsequently, the permeation-preventing layer 620 is formed on the planarization layer 600 to cover the planarization layer 600, and then the passivation layer 640 is formed on the permeation-preventing layer 620.

The organic electroluminescent device of the present invention includes the permeation-preventing layer 620 converted into an oxide layer in case oxygen ($O_2$) or water ($H_2O$) is permeated, unlike the conventional organic electroluminescent device. Hence, oxygen ($O_2$) or water ($H_2O$) permeated after the permeation-preventing layer 620 is converted into the oxide layer is not permeated into the inside of the permeation-preventing layer 620.

Figure 6B:
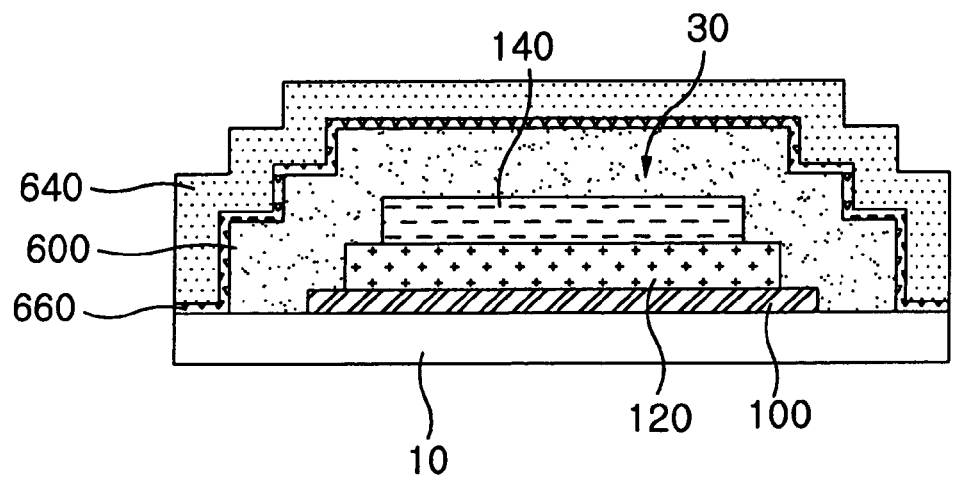
FIG. 6B is a plane view illustrating an organic electroluminescent device according to a fifth embodiment of the present invention.

FIG. 6B is a plane view illustrating an organic electroluminescent device according to a fifth embodiment of the present invention.

In FIG. 6B, the organic electroluminescent device of the present invention includes pixels 30, a planarization layer 600, a permeation-preventing layer 660 and a passivation layer 640.

Since the elements of the present embodiment except the permeation-preventing layer 660 are the same as those in the first embodiment, any further detailed descriptions concerning the same elements will be omitted.

The permeation-preventing layer 660 as an oxide layer is formed by forming a metal layer such as Al, Ti or TiN on the planarization layer 600, and then oxidizing the metal layer in an oxygen atmosphere. In other words, the permeation-preventing layer 660 is formed before oxygen ($O_2$) or water ($H_2O$) is permeated, unlike the permeation-preventing layer 320 in the fourth embodiment.

Figure 7A:
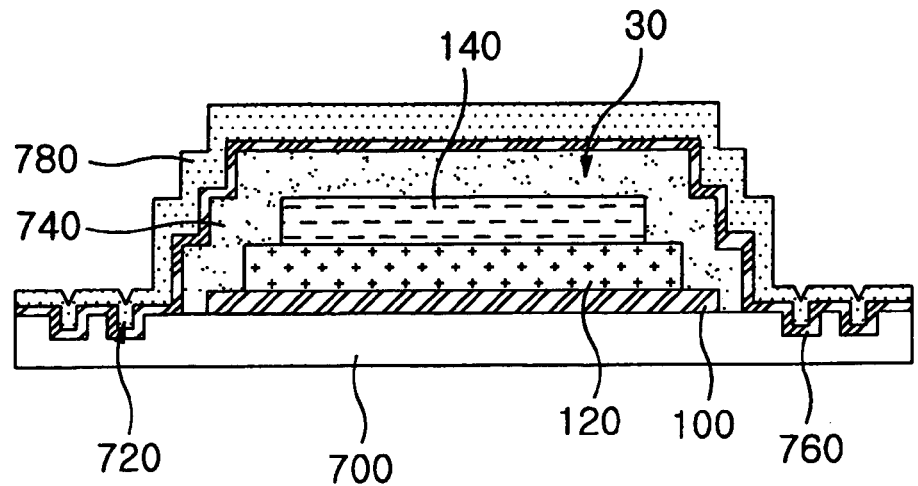
FIG. 7A is a plane view illustrating an organic electroluminescent device according to a sixth embodiment of the present invention.

FIG. 7A is a plane view illustrating an organic electroluminescent device according to a sixth embodiment of the present invention.

In FIG. 7A, the organic electroluminescent device of the present invention includes a substrate 700, pixels 30, a planarization layer 740, a permeation-preventing layer 760 and a passivation layer 780.

The substrate 700 has grooves 720 at the periphery of an active area as shown in FIG. 7A.

The planarization layer 740 is formed on the pixels 30 to cover the pixels 30, and is made up of non-conductive organic layer such as BCB or SiLK.

The permeation-preventing layer 760 is formed to cover the planarization layer 740 and grooves 720, and is made up of metal such as Al, Ti or TiN. Here, the metal is reactive to oxygen ($O_2$) or water ($H_2O$). Hence, the metal is oxidized in case oxygen ($O_2$) or water ($H_2O$) is permeated, and so the permeation-preventing layer 760 is converted into an oxide layer. The density of the converted oxide layer is higher than that of the metal, and thus oxygen ($O_2$) or water ($H_2O$) is not diffused along the converted oxide layer. As a result, after the oxide layer is formed, oxygen ($O_2$) or water ($H_2O$) is not permeated into the inside of the permeation-preventing layer 760.

The passivation layer 780 is formed on the permeation-preventing layer 760.

The passivation layer 780 according to another embodiment of the present invention is formed by depositing in sequence a first silicon oxide layer, a silicon nitride layer and a second silicon oxide layer on the permeation-preventing section 760.

The passivation layer 780 according to another embodiment of the present invention is formed by depositing in sequence a first silicon oxide layer, a first silicon nitride layer, a second silicon oxide layer, a second silicon nitride layer and a third silicon oxide layer on the permeation-preventing layer 760.

Hereinafter, a process of manufacturing the organic electroluminescent device will be described in detail.

The grooves 720 are formed on the substrate 700 by etching the substrate 700 by using a certain mask.

Subsequently, the pixels 30 are formed on the substrate 700.

Then, the planarization layer 740 is deposited on the pixels 30 to cover the pixels 30.

Subsequently, the permeation-preventing layer 760 is formed on the substrate 700 on which the planarization 740 and the grooves 720 are formed.

Then, the passivation layer 780 is formed on the permeation-preventing layer 760.

In a method of manufacturing the organic electroluminescent device according to another embodiment of the present invention, the grooves 720 are formed after the planarization layer 740 is deposited on the pixels 30. In this case, the grooves 720 should be formed in a vacuum atmosphere in order to prevent the permeation of oxygen ($O_2$), water ($H_2O$), etc.

Figure 7B:
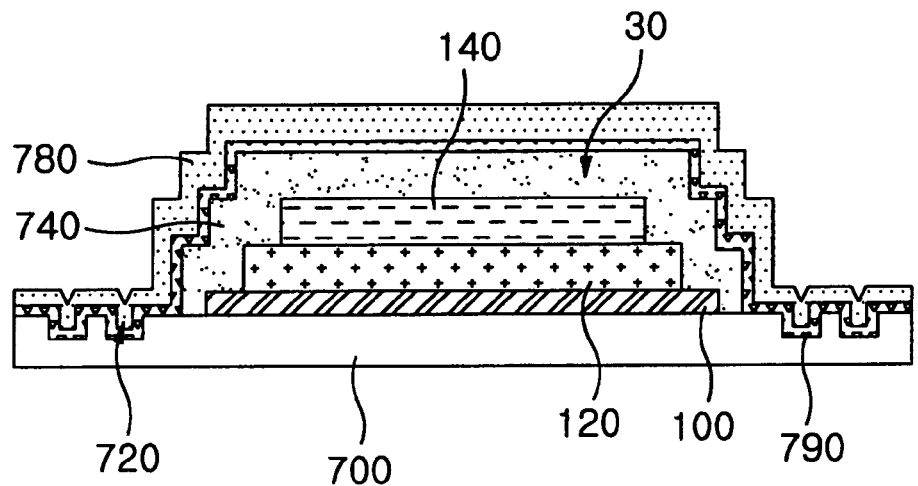
FIG. 7B is a plane view illustrating an organic electroluminescent device according to a seventh embodiment of the present invention.

FIG. 7B is a plane view illustrating an organic electroluminescent device according to a seventh embodiment of the present invention.

In FIG. 7B, the organic electroluminescent device of the present invention includes a substrate 700, pixels 30, a planarization layer 740, a permeation-preventing layer 790 and a passivation layer 780.

Since the elements of the present invention except the permeation-preventing layer 790 are the same as those in the sixth embodiment, any further detailed descriptions concerning the same elements will be omitted.

The permeation-preventing layer 790 as an oxide layer is formed by forming a metal layer such as Al, Ti or TiN to cover the substrate 700 on which the planarization layer 740 and the grooves 720 are formed, and then oxidizing the metal layer in an oxygen atmosphere. In other words, the permeation-preventing layer 790 is formed before oxygen ($O_2$) or water ($H_2O$) is permeated, unlike the permeation-preventing layer 760 in the sixth embodiment.

Figure 8A:
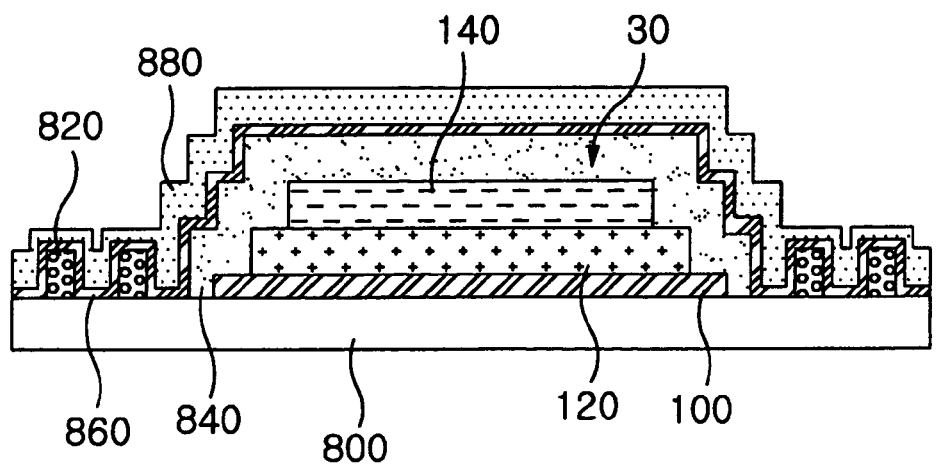
FIG. 8A is a plane view illustrating an organic electroluminescent device according to an eighth embodiment of the present invention.

FIG. 8A is a plane view illustrating an organic electroluminescent device according to an eighth embodiment of the present invention.

In FIG. 8A, the organic electroluminescent device of the present invention includes path extending sections 820, pixels 30, a planarization layer 840, a permeation-preventing layer 860 and a passivation layer 880.

The path extending sections 820 are formed on the substrate 800 at the periphery of an active area in which the pixels 30 are formed. Here, the path extending sections 820 have square shape, rectangular shape, or overhang shape.

The planarization layer 840 covers the pixels 30, and is made up of non-conductive organic film such as BCB or SiLK.

The permeation-preventing layer 860 is formed to cover the planarization layer 840 and the path extending sections 820, and is made up of metal such as Al, Ti or TiN. Here, the metal is reactive to oxygen ($O_2$) or water ($H_2O$). Hence, the metal is oxidized in case oxygen ($O_2$) or water ($H_2O$) is permeated, and so the permeation-preventing layer 860 is converted into an oxide layer. The density of the converted oxide layer is higher than that of the metal, and thus oxygen ($O_2$) or water ($H_2O$) is not diffused along the converted oxide layer. As a result, after the oxide layer is formed, oxygen ($O_2$) or water ($H_2O$) is not permeated into the inside of the permeation-preventing layer 860.

The passivation layer 880 as an inorganic layer is formed on the permeation-preventing layer 860.

Hereinafter, a process of manufacturing the organic electroluminescent device of the present invention will be described in detail.

The pixels 30 are formed on the substrate 800.

Subsequently, the planarization layer 840 is deposited to cover the pixels 30.

Then, the path extending sections 820 are formed at the periphery of the planarization layer 840 on the substrate 800. In another embodiment, the path extending sections 820 may be formed before the pixels 30 are formed on the substrate 800. The path extending sections 820 may be formed on the substrate 800 when a wall 180 is formed.

Subsequently, the permeation-preventing layer 860 is formed on the substrate 800 on which the planarization layer 840 and the path extending layers 820 are formed.

Then, the passivation layer 880 is formed on the permeation-preventing layer 860.

Figure 8B:
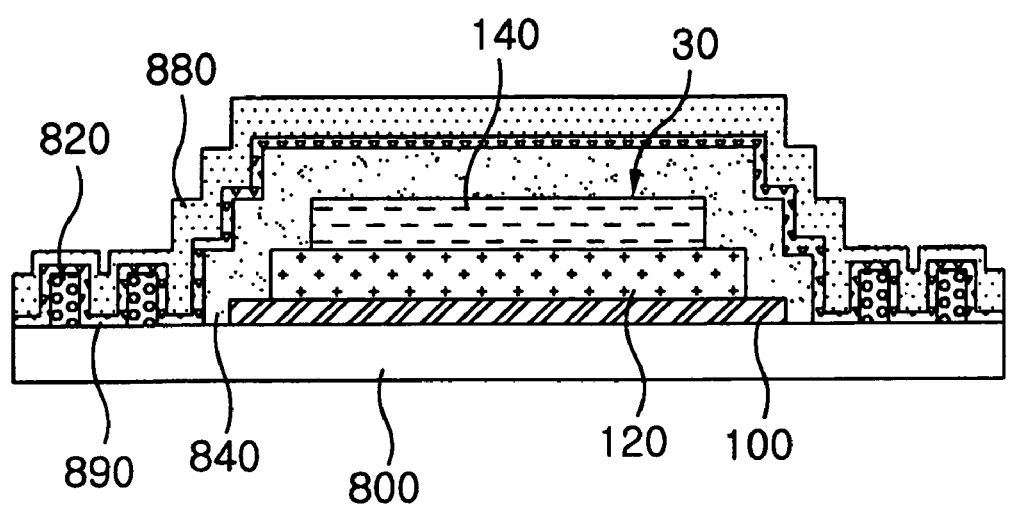
FIG. 8B is a plane view illustrating an organic electroluminescent device according to a ninth embodiment of the present invention.

FIG. 8B is a plane view illustrating an organic electroluminescent device according to a ninth embodiment of the present invention.

In FIG. 8B, the organic electroluminescent device of the present invention includes pixels 30, a planarization layer 840, a permeation-preventing layer 890 and a passivation layer 880.

Since the elements of the present invention except the permeation-preventing layer 890 are the same as those in the eighth embodiment, any further detailed descriptions will be omitted.

The permeation-preventing layer 890 as an oxide layer is formed by forming a metal layer such as Al, Ti or TiN to cover the substrate 800 on which the planarization layer 840 and the path extending sections 820 are formed, and then oxidizing the metal layer in an oxygen atmosphere. In other words, the permeation-preventing layer 890 is formed before oxygen ($O_2$) or water ($H_2O$) is permeated, unlike the permeation-preventing layer 860 in the eighth embodiment.

From the preferred embodiments for the present invention, it is noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. An organic electroluminescent device comprising:
   a substrate having grooves formed at the periphery of an active area;
   a plurality of pixels formed in the active area;
   a planarization layer formed on the pixels on the substrate, wherein at least a portion of the planarization layer is directly contacted with the substrate; and
   a passivation layer formed on the planarization layer and the grooves, wherein at least a portion of the passivation layer is directly contacted with the substrate,
   wherein the passivation layer is filled in the grooves.

2. The organic electroluminescent device of claim 1, wherein the planarization layer is a non-conducting organic layer.

3. The organic electroluminescent device of claim 2, wherein the planarization layer contains BenzoCyclo-Butene or SiLK.

4. The organic electroluminescent device of claim 1, wherein the passivation layer is an inorganic layer as a layer for preventing oxygen and water.

5. A method of manufacturing an organic electroluminescent device comprising:
   forming a plurality of grooves at a periphery of an active area on a substrate;
   forming a plurality of pixels in the active area;
   forming a planarization layer on the pixels so that at least a portion of the planarization layer is directly contacted with the substrate; and
   forming a passivation layer on the planarization layer and the grooves so that at least a portion of the passivation layer is directly contacted with the substrate and the passivation layer is filled in the grooves.

6. The organic electroluminescent device of claim 1, further including a permeation-preventing layer formed between the planarization layer and the passivation layer.

7. The organic electroluminescent device of claim 6, wherein the planarization layer is a non-conducting organic layer.

8. The organic electroluminescent device of claim 7, wherein the planarization layer contains BenzoCyclo-Butene or SiLK.

9. The organic electroluminescent device of claim 6, wherein the passivation layer is an inorganic layer as a layer for preventing oxygen and water.

10. The organic electroluminescent device of claim 6, wherein the permeation preventing layer includes aluminium (Al), titanium (Ti), or titanium nitride (TiN).

11. The organic electroluminescent device of claim 6, wherein the permeation-preventing layer is an oxide layer.

\* \* \* \* \*